(12) United States Patent
Morakhia

(10) Patent No.: US 12,231,133 B2
(45) Date of Patent: Feb. 18, 2025

(54) SELF-REFERENCED DELAY CELL-BASED TIME-TO-DIGITAL CONVERTER

(71) Applicant: NVIDIA Corporation, Santa Clara, CA (US)

(72) Inventor: Anish Morakhia, Mountain View, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 18/144,967

(22) Filed: May 9, 2023

(65) Prior Publication Data
US 2023/0275587 A1  Aug. 31, 2023

Related U.S. Application Data

(63) Continuation of application No. 17/542,269, filed on Dec. 3, 2021, now Pat. No. 11,683,043.

(51) Int. Cl.
*H03L 7/089* (2006.01)
*H03L 7/099* (2006.01)

(52) U.S. Cl.
CPC ............ *H03L 7/089* (2013.01); *H03L 7/0992* (2013.01)

(58) Field of Classification Search
CPC ........ H03K 5/134; H03K 5/133; H03K 5/131; H03K 5/13; H03K 2005/00208;
(Continued)

(56) References Cited

U.S. PATENT DOCUMENTS 9,712,197 B2   7/2017  Ripley
11,258,450 B2  2/2022  Karandikar
(Continued)

FOREIGN PATENT DOCUMENTS

CN   104050134 A   9/2014
CN   105897258 A   8/2016
(Continued)

OTHER PUBLICATIONS

Zanuso, M. et al., "Time-to-Digital Converter with 3-ps Resolution and Digital Linearization Algorithm," IEEE, 2010, pp. 262-265.
(Continued)

*Primary Examiner* — Diana J. Cheng
(74) *Attorney, Agent, or Firm* — Lowenstein Sandler LLP

(57) ABSTRACT

A time-to-digital converter (TDC) circuit includes self-referenced delay cell circuits each including: a first inverter coupled with a second inverter, the first inverter receiving a positive time signal representative of an incoming up signal; a third inverter coupled with a fourth inverter, the third inverter receiving a negative time signal representative of an incoming down signal; a first bank of capacitors coupled to a first node between the first/second inverters; and a second bank of capacitors coupled to a second node between the third/fourth inverters. Control logic generates first control signals, each with an up value, to selectively control the first bank of capacitors. Control logic generates second control signals, each with a down value, to selectively control the second bank of capacitors. The up values vary relative to the down values across the first control signals and the second control signals.

20 Claims, 4 Drawing Sheets

(58) Field of Classification Search
CPC ....... H03K 3/0322; H03K 2005/00195; H03K 2005/0015; H03K 2005/00013; H03K 5/00; H03K 5/1565; H03K 5/156
See application file for complete search history.

(56) References Cited

U.S. PATENT DOCUMENTS

| | | |
|---|---|---|
| 11,265,008 B2 | 3/2022 | Alhoshany |
| 2010/0134170 A1 | 6/2010 | Wang |
| 2017/0346516 A1 | 11/2017 | Ripley et al. |
| 2018/0181077 A1 | 6/2018 | Salle et al. |
| 2019/0190505 A1* | 6/2019 | Yi .......................... H03K 5/14 |
| 2021/0021272 A1 | 1/2021 | Karandikar et al. |
| 2021/0218411 A1 | 7/2021 | Alhoshany et al. |

FOREIGN PATENT DOCUMENTS

| | | |
|---|---|---|
| CN | 107046421 A | 8/2017 |
| CN | 107294530 A | 10/2017 |

OTHER PUBLICATIONS

Office Action for Chinese Patent Application No. 202211385614.7, mailed Dec. 23, 2024, 15 pages with machine translation.

\* cited by examiner

SELF-REFERENCED DELAY CELL-BASED TIME-TO-DIGITAL CONVERTER

RELATED APPLICATIONS

The present application is a continuation of U.S. patent application Ser. No. 17/542,269, filed Dec. 3, 2021, which is incorporated by reference herein.

TECHNICAL FIELD

At least one embodiment pertains generally to phase-locked loops (PLLs), and more specifically, to a self-referenced delay cell-based time-to-digital converter (TDC) in a PLL.

BACKGROUND

A phase-locked loop (PLL) is a control system that generates an output signal whose phase is related to the phase of an input signal. There are several different types, but the simplest is an electronic circuit that includes a variable frequency oscillator and a phase detector in a feedback loop. The oscillator generates a periodic signal, and the phase detector compares the phase of that signal with the phase of the input periodic signal, adjusting the oscillator to keep the phases matched. Thus, the PLL operates on two inputs that can be understood as a reference clock and a feedback clock. Part of the function of the PLL is to approximate the delay between these two inputs in order to make matching adjustments.

In certain PLLs, a time-to-digital converter (TDC) is often employed to accurately define the gain and allow digital tracking of the spread spectrum of the reference clock. Different limitations exist within these TDCs, which may include a systematic offset particularly when the PLL is a hybrid PLL, e.g., that employs analog proportional path circuitry along with digital integral path circuitry, where the TDC digitizes delay values for the latter. These limitations increase when trying to achieve very small step sizes in differences between the reference clock and the feedback clock, e.g., in the order of a picosecond or a few picoseconds.

BRIEF DESCRIPTION OF DRAWINGS

Various embodiments in accordance with the present disclosure will be described with reference to the drawings, in which.

DETAILED DESCRIPTION

Figure 1:
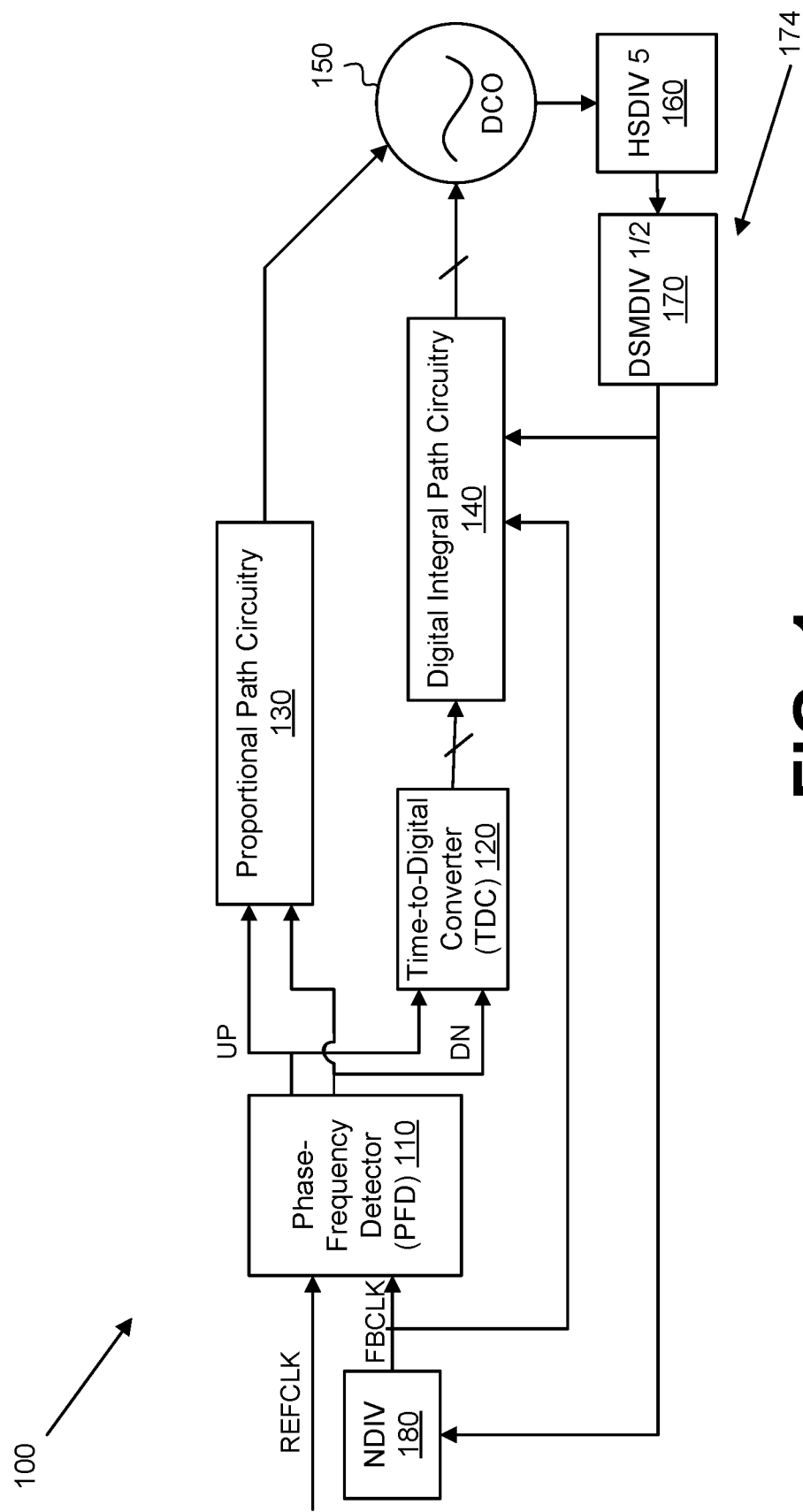
FIG. 1 is a schematic block diagram of a phase-locked loop (PLL) employing a time-to-digital converter (TDC) circuit, in accordance with at least some embodiments.

Aspects and embodiments of the present disclosure address the above mentioned complexities and challenges with employing TDC circuits within PLLs by employing self-referenced delay cell circuits within the TDC circuit, e.g., that distinguishes from use of multiple single-ended delay cell circuits that have a common timing reference. In certain PLLs, a linear TDC circuit is employed to accurately define the gain and allow tracking of spread spectrum reference clock. For low jitter applications, the PLL uses a high resolution TDC circuit with a moderate range. Also, the TDC step size variation is tightly controlled to meet the bandwidth specifications imposed by standards like PCI Express® (PCIe).

In certain PLLs, these constraints are met by a flash TDC circuit that uses the difference between two delay values to obtain high resolution. A flash TDC circuit can be understood as being similar to a flash analog-to-digital converter that employs multiple delay cell circuits, where the TDC time step is implemented as a difference between two delay cell circuits with different settings. The delay in delay cell circuits can be programmed by variably changing, using control logic, capacitance in each respective delay cell circuit. The TDC step size variation is countered by using logic that implements Dynamic Element Matching (DEM) based on pseudo-random binary sequence (PRBS) such as the PRBS31 pattern. The control logic can employ this PRBS pattern to shuffle threshold values of the delay cell circuits each cycle, to attempt to reduce the impact of mismatch and linearize the flash TDC circuit.

In these TDC circuits, however, there are limitations because the design uses single-ended delay cells that have a common reference. For example, the outputs of the multiple delay cell circuits, which process an UP signal of the reference clock, may be provided by flip-flops or latches that are timed based on the output of a single delay cell circuit that processes the down (DN) signal of the feedback clock. This DN single delay cell circuit generates the common reference (which can be delayed by a fixed amount) that drives the latches of all of the UP delay cell circuits, which are delayed by different amounts according to the PRBS pattern. These single-ended delay cell circuits can cause unmatched input paths that lead to systematic offset at the input of the TDC circuit, which is difficult to compensate for in TDC circuit/PLL implementation design.

For example, while attempts are made at loading the DN signal with dummy loads to create symmetry, it is difficult to do so accurately because, by design, the fan-out signals between the UP/DN delay cell circuits are not symmetric. More specifically, the one common reference from the single DN delay cell circuit employs a high number of fan-out signals that drive all the UP latches and, for the UP delay cell circuits, employ a low number of fan-out signals as each UP delay cell circuit drives a single latch of the UP latches. The combination of the outputs from these latches is a thermometric code, which can be understand as an entropy encoding that represents a natural number. A final binary code is generated by summing these thermometric outputs. As mentioned previously, the systematic offset is a more problematic issue when using a PLL in a hybrid mode with analog proportional path circuitry and digital integral path circuitry, leading to reference spurs in the outputs of the TDC circuit.

Further, the single-ended TDC circuit design has to deal with the challenge of asymmetric positive and negative thresholds exhibited across the multiple delay cell circuits. A positive threshold is created by adding capacitance and a negative threshold is created by removing capacitance from a given delay cell circuit. The resistance/capacitance (RC) value of each node in the delay cell circuits varies as the capacitances vary. Changing capacitance is a non-linear process that generally works well in small delay ranges, e.g., within 10-20% of a capacitor value, but not in large delay ranges. In practice, the act of adding capacitance and removing capacitance is close to identical, but is not identical. Thus, although small, this asymmetry is an issue when trying to achieve very small step sizes of the order of 1-3 picoseconds (ps), for example.

Aspects of the present disclosure address the above and other deficiencies by employing self-referenced delay cell circuits within the TDC circuit of a PLL, so as to remove the single-ended common reference of prior designs. For example, each self-referenced delay cell circuit can include a first inverter coupled in series with a second inverter, the first inverter to receive a positive time signal representative of an incoming up signal (UP), and a third inverter coupled in series with a fourth inverter, the third inverter to receive a negative time signal representative of an incoming down signal (DN). Each self-referenced delay cell circuit can further include a first bank of capacitors coupled to a first node between the first inverter and the second inverter, control logic selectively controls the first bank of capacitors by a first control signal that corresponds to a positive threshold. Each self-referenced delay cell circuit can further include a second bank of capacitors coupled to a second node between the third inverter and the fourth inverter, where the control logic selectively controls the second bank of capacitors by a second control signal that corresponds to a negative threshold. In this way, the second bank of capacitors in each delay cell circuit can be controlled independently of the first bank of capacitors, also eliminating any asymmetry between the positive and negative thresholds.

In these embodiments, the disclosed TDC circuit can further include phase detectors coupled to respective outputs of the of self-referenced delay cell circuits and an adder coupled to outputs of the phase detectors. The adder can be configured to generate a multi-bit output that represents a time difference between the incoming up signal and the incoming down signal. Due to a mismatch between logic and the number of delay cell circuits that are efficiency employed, mapping logic can be employed to map the multi-bit output to a digital code that is at least one bit smaller than the multi-bit output and quantifies the time difference.

Therefore, advantages of the systems and methods implemented in accordance with some embodiments of the present disclosure include, but are not limited to, the ability to match input paths of the multiple delay cell circuits of the TDC circuit, eliminating systematic offset, and the ability to make positive thresholds match (e.g., be symmetric to) negative thresholds. The disclosed TDC circuit is compatible with DEM logic, reducing the impact of mismatch in the delay cell circuits and reducing non-linearity of the TDC circuit. Other advantages will be apparent to those skilled in the art of TDC circuit-based PLLs discussed hereinafter.

FIG. 1 is a schematic block diagram of a phase-locked loop (PLL) 100 employing a TDC circuit 120, in accordance with at least some embodiments. In at least some embodiments, the PLL 100 includes a phase-frequency detector (PFD) 110, proportional path circuitry 130, the TDC circuit 120, digital integral path circuitry 140, a digitally-controlled oscillator (DCO) 150, a high-speed frequency divider (HSDIV) 160, a delta-sigma modulator frequency divider (DSMDIV) 170, and a integer frequency divider (NDIV) 180. Thus, the TDC circuit 120 is coupled between the phase-frequency detector 110 and the DCO 150, the digital integral path circuitry 140 is coupled between the TDC circuit 120 and the DCO 150, and the proportional path circuitry 130 is coupled between the phase-frequency detector 110 and the DCO 150.

In at least some embodiments of the PLL 100, the PFD 110 receives a reference clock (REFCLK) and a feedback clock (FBCLK) from a feedback loop 174 of the PLL 100. The PFD 110 detects the frequency/phase of the reference clock and the feedback clock, and generates two corresponding signals, e.g., an UP signal for the frequency/phase of the reference clock and a DN signal for the frequency/phase of the feedback clock. Both the UP and DN signals are provided to the proportional path circuitry 130 and the TDC circuit 120. As discussed, in hybrid mode of the PLL 100, the proportional path circuitry 130 is analog circuitry, e.g., to include a charge pump, a low pass filter, and other filtering circuitry. The proportional path circuitry 130 is designed to impart proportional processing to the UP/DN signals.

In these embodiments, the TDC circuit 120 converts the UP/DN signals to digital values that can be combined and processed into a final digital code that quantifies the time difference between the UP/DN signals. This final digital code can, in some embodiments, be a 4-bit digital code, although others are also possible. The digital code is fed into the digital integral path circuitry 140, which then performs integral processing of the UP/DN signals based on the digital code generated by the TDC circuit 120.

In these embodiments, outputs of both paths, including the proportional path circuitry 130 and the digital integral path circuitry 140, are input into the DCO 150. In this way, the two proportional and integral paths join together to cause changes in the frequency of the DCO 150 in a continuous, feedback loop. The feedback loop 174, in turn, can include the HSDIV 160, the DSMDIV 170, and the NDIV 180 components that divide the DCO-generated signal down in such a way to generate the feedback clock (FBCLK).

In various embodiments, any offset (e.g., systematic offset) that the TDC circuit 120 exhibits causes the proportional path circuitry 130 and the digital integral path circuitry 140 contend (e.g., via the DCO 150), for a resolution to phase-based timing. This contention is won by the digital integral path circuitry 140 due to having a higher gain. This can result in a offset at the input of the PLL 100, resulting in spurs in the PLL 100 output at the reference clock frequency. This and the other deficiencies in single-ended-based TDC circuits are resolved by the self-referenced delay cell-based TDC circuit described below.

Figure 2A:
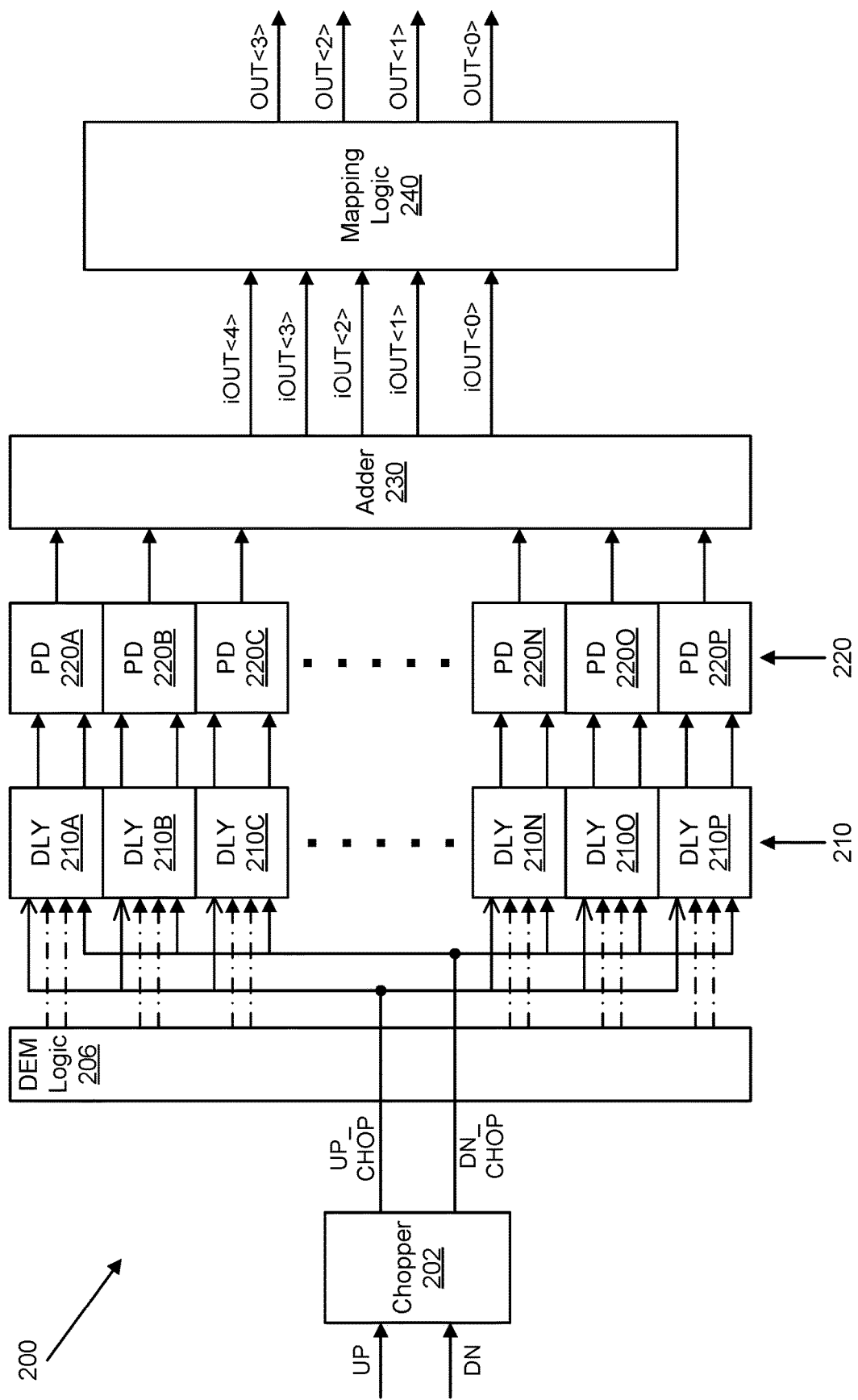
FIG. 2A is a schematic block diagram of a self-referenced delay cell-based TDC circuit, in accordance with at least some embodiments.
Figure 2B:
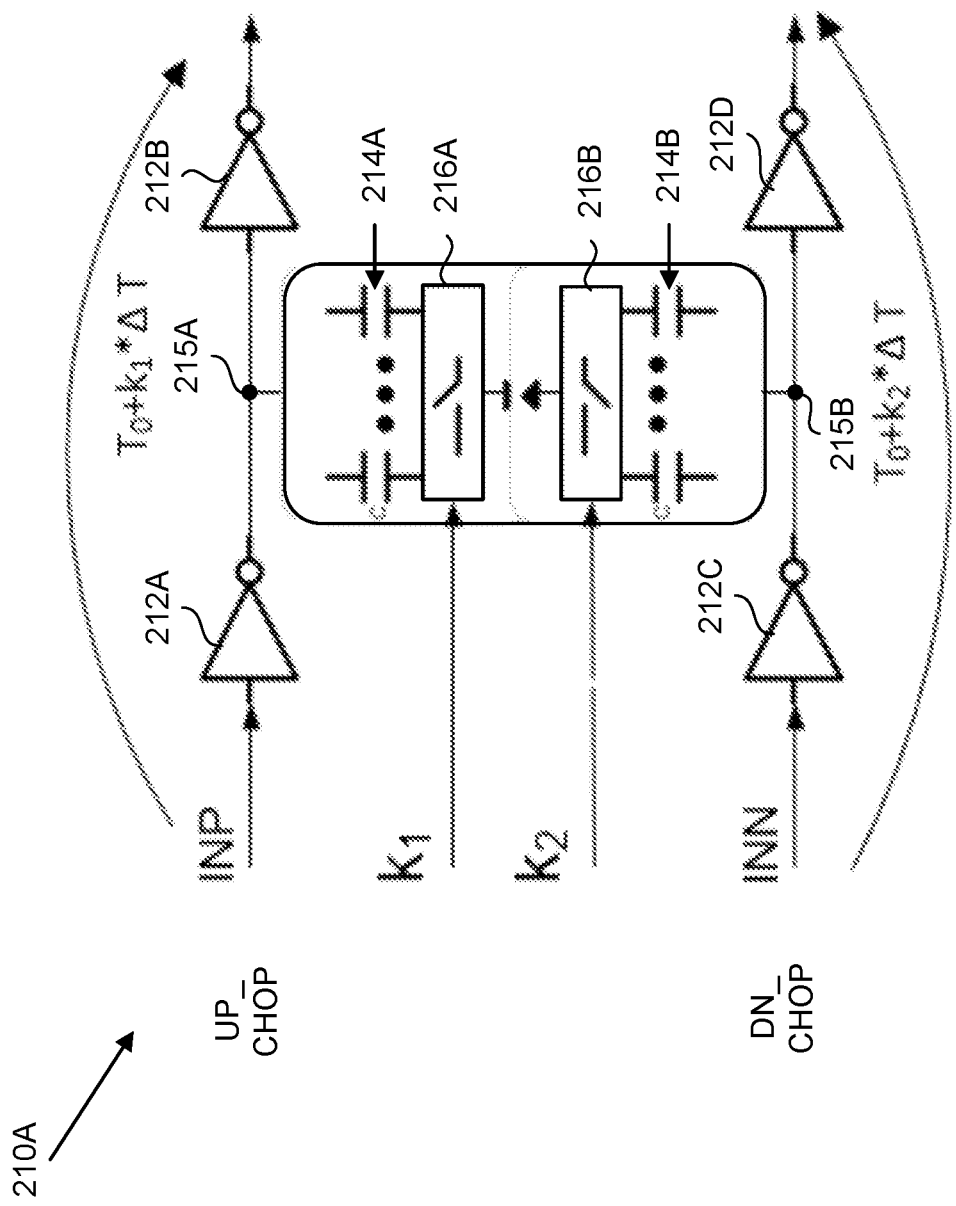
FIG. 2B is a schematic block diagram of one of the self-referenced delay cell circuits in the TDC circuit, in accordance with at least some embodiments.

FIG. 2A is a schematic block diagram of a self-referenced delay cell-based TDC circuit 200, in accordance with at least some embodiments. In some embodiments, the TDC circuit 200 is employed as the TDC circuit 120 of the PLL 100 discussed with reference to FIG. 1. In these embodiments, the TDC circuit 200 includes a chopper 202 that samples or otherwise dissects the UP signal of the reference clock and the DN signal of the feedback clock. The TDC circuit 200 further includes DEM logic 206, also referred to herein as control logic, multiple self-referenced delay cell circuits 210 (illustrated as DLY), multiple phase detectors 220A (illustrated as PD) coupled to respective ones of the multiple self-referenced delay cell circuits 210, an adder 230 coupled to outputs of the multiple phase detectors 220A, and a mapping logic 240 coupled to the output of the adder 230. FIG. 2B is a schematic block diagram of a first self-referenced delay cell circuit 210A of the multiple self-referenced delay cell circuits 210 in the TDC circuit 200, illustrated by way of example for the structure of each of the multiple self-referenced delay cell circuits 210, in accordance with at least some embodiments.

In at least some embodiments, the multiple self-referenced delay cell circuits 210 include a first self-referenced delay cell circuit 210A, a second self-referenced delay cell circuit 210B, a third self-referenced delay cell circuit 210C, a fourth self-referenced delay cell circuit 210N, a fifth self-referenced delay cell circuit 210O, and a sixth self-referenced delay cell circuit 210P. Correspondingly, the multiple phase detectors (each of which can be a flip-flop, a latch, or the like) include a first phase detector 220A, a second phase detector 220B, a third phase detector 220C, a fourth phase detector 220N, a fifth phase detector 220O, and a sixth phase detector 220P coupled to outputs of respectively numbered self-referenced delay cell circuits. While FIG. 2A illustrates six each of the multiple self-referenced delay cell circuits 210 and the multiple phase detectors 220, the intervening dots indicate that there can be more of each, e.g., by way of example, 16 of each that operate in pairs.

In these embodiments, sampled portions of the UP signal (UP_CHOP) and the DN signal (DN_CHOP) are provided to each of the multiple self-referenced delay cell circuits 210. The DEM logic 206 also sends two control signals (k1, k2) to each of the multiple self-referenced delay cell circuits 210, as illustrated in FIG. 2B and that are represented by the dashed-dotted lines in FIG. 2A. In this way, each self-referenced delay cell circuit gets the DN portion of the input DN signal as its own reference, eliminating systematic offsets between sets of delay cell circuits.

In various embodiments, each self-referenced delay cell circuit 210 includes a first inverter 212A coupled in series with a second inverter 212B, the first inverter 212A to receive a positive time signal (INP) representative of an incoming up signal and a third inverter 212C coupled in series with a fourth inverter 212D, the third inverter 212C to receive a negative time signal (INN) representative of an incoming down signal. The capacitor bank in each delay cell circuitry can then be split, within each of the multiple self-referenced delay cell circuits 210, into a first bank of capacitors 214A and a second bank of capacitors 214B. While these inverters can be used in delay cell circuits, other buffers or similar components can also be used.

In these embodiments, the first bank of capacitors 214A is coupled to a first node 215A between the first inverter 212A and the second inverter 212B. The first bank of capacitors 214A is selectively controlled by a first control signal, from the DEM logic 206, that corresponds to a positive threshold. For example, the DEM logic 206 can selectively control a first switch 216A that is coupled to the first bank of capacitors 214A. Further, in these embodiments, the second bank of capacitors 214B is coupled to a second node 215B between the third inverter 212C and the fourth inverter 212D. The second bank of capacitors 214B is selectively controlled by a second control signal, from the DEM logic 206, that corresponds to a negative threshold. For example, the DEM logic 206 can selectively control a second switch 216B that is coupled to the second bank of capacitors 214B. Because adding a positive threshold or removing a negative threshold is performed discretely within each respective self-referenced delay cell circuit with identically-mirrored banks of capacitors, positive thresholds can be created that are symmetric to negative thresholds, reducing non-linearities. Thus, in some embodiments, the capacitors of the first bank of capacitors 214A are equal in size and number to capacitors of the second bank of capacitors 214B in order provide such identically-mirror banks of capacitors.

In these embodiments, the TDC circuit 200 further includes the multiple phase detectors 220 coupled to respective outputs of the multiple self-referenced delay cell circuits 210, and the adder 230 coupled to outputs of the multiple phase detectors 220. In some embodiments, the adder 230 generates a multi-bit output (iOUT<4:0>) that represents a time difference between the incoming up signal and the incoming down signal, e.g., as a thermometric code. Thus, the adder 230 can be an adder based therm2 bin in some embodiments.

TABLE 1

| k1 | k2 | k1 − k2 | k1 + k2 |
|----|----|---------|---------|
| 0  | 7  | −7      | 7       |
| 0  | 6  | −6      | 6       |
| 1  | 6  | −5      | 7       |
| 1  | 5  | −4      | 6       |
| 2  | 5  | −3      | 7       |
| 2  | 4  | −2      | 6       |
| 3  | 4  | −1      | 7       |
| 3  | 3  | 0       | 6       |
| 4  | 3  | 1       | 7       |
| 4  | 2  | 2       | 6       |
| 5  | 2  | 3       | 7       |
| 5  | 1  | 4       | 6       |
| 6  | 1  | 5       | 7       |
| 6  | 0  | 6       | 6       |
| 7  | 0  | 7       | 7       |
|    |    | Total   | 98      |

In various embodiments, the mapping logic 240 is further coupled to the adder 230 and configured to map the multi-bit output to a digital code (e.g., OUT<3:0>) that is at least one bit smaller than the multi-bit output and quantifies the time difference. This mapping logic 240 may be employed due to the encoding into the digital code fewer than all of the outputs from the multiple phase detectors 220. In these embodiments, however, including the larger (and 2N) number of delay cell circuit/phase detector pairs makes it easier to shuffle the control signal values across the multiple self-referenced delay cell circuits 210, as will be described in more detail. Thus, in some embodiments, the mapping logic 240 may include saturation logic, chopper demodulation logic, and TDC_NBIT logic in order to convert the 5-bit output from the adder 230 into the 4-bit output of the mapping logic 240. While specific numbers of bits are illustrated in these outputs, different embodiments may vary the number of bits in these outputs.

In disclosed embodiments, and with further reference to FIGS. 2A-2B and to Table 1, the control logic (e.g., the DEM logic 206), is configured to generate first control signals to selectively control the first bank of capacitors 214A of the multiple self-referenced delay cell circuits 210, where respective ones of the first control signals include an up value (k1). In the disclosed embodiments, the control logic is further configured to generate second control signals to selectively control the second bank of capacitors 214B of the multiple self-referenced delay cell circuits 210, where respective ones of the second control signals include a down value (k2).

In these embodiments, the control logic is configured to vary the up values relative to the down values across the first and second control signals. There are multiple ways to do this, but one way is illustrated in Table 1, where k1 values and k2 values are programmed in a ping-pong fashion, increasing one k value at a time, back and forth, e.g., increasing k1 followed by decreasing k2, and so forth repeating this increasing of k1 and decreasing of k2. As can be seen, the positive thresholds and the negative thresholds are symmetric by being implemented by swapping k1/k2 settings across the multiple self-referenced delay cell circuits 210. Thus, in some embodiments, the control logic is configured to alternate incrementing the up value within respective ones of the first control signals with decrementing the down value within respective ones of the second control signals, as in Table 1. However, the control logic can also be configured to alternate incrementing the up value within respective ones of the first control signals with decrementing the down value within respective ones of the second control signals.

In at least some embodiments, the control logic is configured to generate the first control signals and the second control signals in control signal pairs, one control signal pair to be provided to each respective self-reference delay cell circuit. In these embodiments, the control logic is further configured to rotate the control signal pairs to different ones of the multiple self-referenced delay cell circuits 210 over time according to one of a sequential pattern or a pseudo-random pattern. This rotating of values further reduces the likelihood of any sort of systemic and random offsets from developing between ones of the multiple self-referenced delay cell circuits 210.

With additional reference to FIGS. 2A-2B and to Table 1, according to an exemplary embodiment, the first self-referenced delay cell circuit 210A is coupled to the control logic and includes the first bank of capacitors 214A coupled to the first node 215B between a first positive input (INP) and a first positive output. The first bank of capacitors 214A is selectively controlled by a first control signal from the control logic, the first control signal including a first up value (e.g., k1=0) corresponding to a first positive threshold. The second bank of capacitors 214B is coupled to the second node 215B between a first negative input (INN) and a first negative output. The second bank of capacitors 214B is selectively controlled by a second control signal from the control logic, the second control signal including a first down value (e.g., k2=7) corresponding to a first negative threshold.

In the exemplary embodiment, the second self-referenced delay cell circuit 210B is coupled to the control logic and includes a third bank of capacitors coupled to a third node between a second positive input and a second positive output. The third bank of capacitors is selectively controlled by a third control signal from the control logic, the third control signal including a second up value equal to the first up value (e.g., k1=0). The second self-reference delay cell circuit 210B further includes a fourth bank of capacitors coupled to a fourth node between a second negative input and a second negative output. The fourth bank of capacitors is selectively controlled by a fourth control signal from the control logic, the fourth control signal including a second down value equal to the first down value minus one (e.g., k2=6).

In the exemplary embodiment, the third self-referenced delay cell circuit 210C is coupled to the control logic and includes a fifth bank of capacitors coupled to a fifth node between a third positive input and a third positive output. The fifth bank of capacitors is selectively controlled by a fifth control signal from the control logic, the fifth control signal including a second up value equal to the first up value plus one (e.g., k1=1). The third self-referenced delay cell circuit 210C further includes a sixth bank of capacitors coupled to a sixth node between a third negative input and a third negative output. The sixth bank of capacitors is selectively controlled by a fourth control signal from the control logic, the fourth control signal including a second down value equal to the first down value minus one (e.g., k2=6).

In the exemplary embodiment, the fourth self-referenced delay cell circuit 210N is coupled to the control logic and includes a seventh bank of capacitors coupled to a seventh node between a fourth positive input and a fourth positive output. The seventh bank of capacitors is selectively controlled by a seventh control signal from the control logic, the seventh control signal including a second up value equal to the first down value minus one (e.g., k1=6). The fourth self-referenced delay cell circuit 210N further includes an eighth bank of capacitors coupled to an eighth node between a fourth negative input and a fourth negative output. The eighth bank of capacitors is selectively controlled by an eighth control signal from the control logic, the eighth control signal including a second down value equal to the first up value plus one (k2=1).

In the exemplary embodiment, the fifth self-referenced delay cell circuit 210O is coupled to the control logic and includes a ninth bank of capacitors coupled to a ninth node between a fifth positive input and a fifth positive output. The ninth bank of capacitors is selectively controlled by a ninth control signal from the control logic, the ninth control signal including a second up value equal to the first down value minus one (e.g., k1=6). The fifth self-referenced delay cell circuit 210O further includes a tenth bank of capacitors coupled to a tenth node between a fifth negative input and a fifth negative output. The tenth bank of capacitors is selectively controlled by a tenth control signal from the control logic, the tenth control signal including a second down value equal to the first up value (e.g., k2=0).

In the exemplary embodiment, the sixth self-referenced delay cell circuit 210P is coupled to the control logic and includes an eleventh bank of capacitors coupled to an eleventh node between a sixth positive input and a sixth positive output. The eleventh bank of capacitors is selectively controlled by an eleventh control signal from the control logic, the eleventh control signal including a second up value equal to the first down value (e.g., k1=7). The sixth self-referenced delay cell circuit 210P further includes a twelfth bank of capacitors coupled to a twelfth node between a sixth negative input and a sixth negative output. The twelfth bank of capacitors is selectively controlled by a twelfth control signal from the control logic, the twelfth control signal including a second down value equal to the first up value (k2=0).

In the exemplary embodiment, at least a seventh self-referenced delay cell circuit (somewhere in the middle of the multiple self-referenced delay cell circuits 210) is coupled to the control logic and includes a thirteenth bank of capacitors coupled to a thirteenth node between a seventh positive input and a seventh positive output. The thirteenth bank of capacitors is selectively controlled by a thirteenth control signal from the control logic, the thirteenth control signal including a second up value (e.g., k1=3). The seventh self-referenced delay cell circuit further includes a fourteenth bank of capacitors coupled to a fourteenth node between a seventh negative input and a seventh negative output. The fourteenth bank of capacitors is selectively controlled by a fourteenth control signal from the control logic, the fourteenth control signal including a second down value equal to the second up value (e.g., k2=3).

TABLE 2

| k1 | k2 | k1 − k2 | k1 + k2 |
|---|---|---|---|
| 0 | 7 | −7 | 7 |
| 0 | 6 | −6 | 6 |
| 0 | 5 | −5 | 5 |
| 0 | 4 | −4 | 4 |
| 0 | 3 | −3 | 3 |
| 0 | 2 | −2 | 2 |
| 0 | 1 | −1 | 1 |
| 0 | 0 | 0 | 0 |
| 1 | 0 | 1 | 1 |
| 2 | 0 | 2 | 2 |
| 3 | 0 | 3 | 3 |
| 4 | 0 | 4 | 4 |
| 5 | 0 | 5 | 5 |
| 6 | 0 | 6 | 6 |
| 7 | 0 | 7 | 7 |
| | | Total | 56 |

In further embodiments, the control logic can alter the generation of values of the first control signals (k1) and the second control signals (k2) in a way that does not follow Table 1. For example, Table 2 can simplify the approach that can minimize power consumption.

TABLE 3

| State No. | k1 | k2 | k1 − k2 |
|---|---|---|---|
| 1 | 0 | 7 | −7 |
| 2 | 0 | 6 | −6 |
| 3 | 1 | 6 | −5 |
| 4 | 1 | 5 | −4 |
| 5 | 2 | 5 | 3 |
| 6 | 2 | 4 | −2 |
| 7 | 3 | 4 | −1 |
| 8 | 3 | 3 | 0 |
| 9 | 4 | 3 | 1 |
| 10 | 4 | 2 | 2 |
| 11 | 5 | 2 | 3 |
| 12 | 5 | 1 | 4 |
| 13 | 6 | 1 | 5 |
| 14 | 6 | 0 | 6 |
| 15 | 7 | 0 | 7 |

In further embodiments, it is possible to reduce the range of the TDC circuit 200 that increases the frequency of unwanted tones produced by the DEM logic 206, if that is desired and/or acceptable within a particular TDC circuit. For example, in Table 3 are illustrated values for the first control signals (k1) and the second control signals (k2), which implements a 4-bit TDC circuit, rotates through 15 states, and generates unwanted tones at fref/15 and its harmonics, where "fref" is the DEM logic clock frequency.

TABLE 4

| State No. | k1 | k2 | k1 − k2 |
|---|---|---|---|
| 1 | 0 | 1 | −1 |
| 1 | 0 | 1 | −1 |
| 1 | 0 | 1 | −1 |
| 1 | 0 | 1 | −1 |
| 1 | 0 | 1 | −1 |
| 2 | 0 | 0 | 0 |
| 2 | 0 | 0 | 0 |
| 2 | 0 | 0 | 0 |
| 2 | 0 | 0 | 0 |
| 2 | 0 | 0 | 0 |
| 3 | 1 | 0 | 1 |
| 3 | 1 | 0 | 1 |
| 3 | 1 | 0 | 1 |

TABLE 4-continued

| State No. | k1 | k2 | k1 − k2 |
|---|---|---|---|
| 3 | 1 | 0 | 1 |
| 3 | 1 | 0 | 1 |

As a further example, Table 4 illustrates values for the first control signals (k1) and the second control signals (k2), which implements a 2-bit TDC circuit, rotates through 3 states, and generates unwanted tones at fref/3 and it harmonics.

TABLE 5

| State No. | k1 | k2 | k1 − k2 |
|---|---|---|---|
| 1 | 0 | 2 | −2 |
| 1 | 0 | 2 | −2 |
| 1 | 0 | 2 | −2 |
| 2 | 0 | 1 | −1 |
| 2 | 0 | 1 | −1 |
| 2 | 0 | 1 | −1 |
| 3 | 0 | 0 | 0 |
| 3 | 0 | 0 | 0 |
| 3 | 0 | 0 | 0 |
| 4 | 1 | 0 | 1 |
| 4 | 1 | 0 | 1 |
| 4 | 1 | 0 | 1 |
| 5 | 2 | 0 | 2 |
| 5 | 2 | 0 | 2 |
| 5 | 2 | 0 | 2 |

As a further example, Table 5 illustrates values for the first control signals (k1) and the second control signals (k2), which implements a 2.5-bit TDC circuit, rotates through 5 states, and generates unwanted tones at fref/5 and it harmonics.

Figure 3:
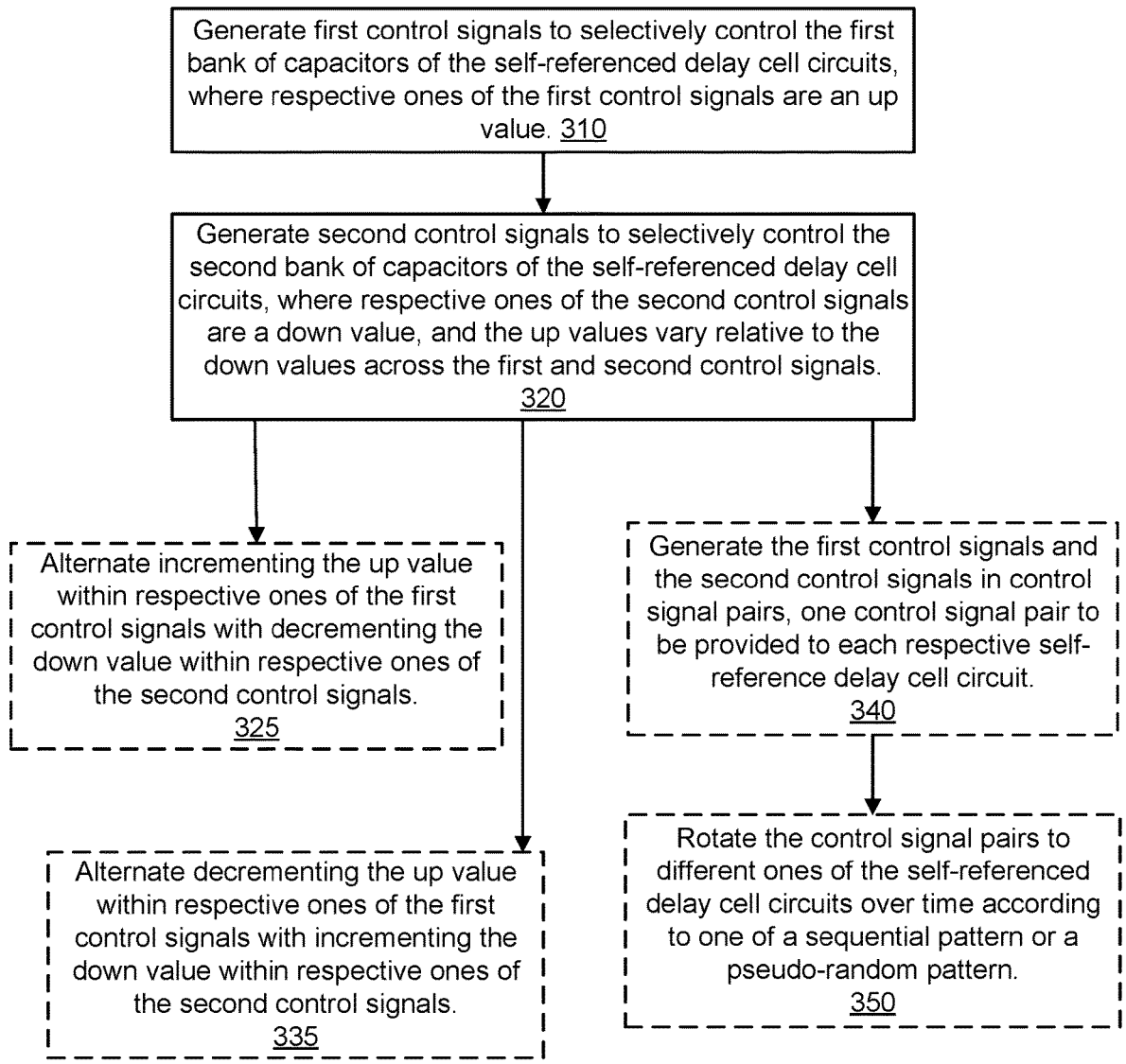
FIG. 3 is a flow diagram of a method for controlling multiple self-referenced delay cell circuits, in accordance with at least some embodiments.

FIG. 3 is a flow diagram of a method 300 for controlling multiple self-referenced delay cell circuits, in accordance with at least some embodiments. The method 300 can be performed by processing logic comprising hardware, software, firmware, or any combination thereof. For example, the method 300 can be performed by the TDC circuit 200, e.g., specifically by the DEM logic 206 of the TDC circuit 200. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic generates multiple first control signals (e.g., k1) to selectively control the first bank of capacitors of the multiple self-referenced delay cell circuits, where respective ones of the multiple first control signals include an up value.

At operation 320, the processing logic generates multiple second control signals (e.g., k2) to selectively control the second bank of capacitors of the multiple self-referenced delay cell circuits, where respective ones of the multiple second control signals include a down value, and the up values vary relative to the down values across the multiple first and second control signals.

At operation 325, the processing logic optionally alternates incrementing the up value within the respective ones of the multiple first control signals with decrementing the down value within respective ones of the multiple second control signals.

At operation 335, the processing logic optionally alternates decrementing the up value within respective ones of the multiple first control signals with incrementing the down value within respective ones of the multiple second control signals.

At operation 340, the processing logic optionally generates the first control signals and the second control signals in control signal pairs, one control signal pair to be provided to each respective self-referenced delay cell circuit.

At operation 350, the processing logic optionally rotates the control signal pairs to different ones of the self-referenced delay cell circuits according to one of a sequential pattern or a pseudo-random pattern.

Other variations are within scope of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A time-to-digital converter (TDC) circuit comprising:
control logic; and
a plurality of self-referenced delay cell circuits coupled to the control logic, wherein each self-referenced delay cell circuit of the plurality of self-referenced delay cell circuits comprises:
a first inverter coupled in series with a second inverter, the first inverter to receive a positive time signal representative of an incoming up signal;
a third inverter coupled in series with a fourth inverter, the third inverter to receive a negative time signal representative of an incoming down signal;
a first bank of capacitors coupled to a first node between the first inverter and the second inverter, wherein the first bank of capacitors is selectively controlled by a first control signal from the control logic; and
a second bank of capacitors coupled to a second node between the third inverter and the fourth inverter, wherein the second bank of capacitors is selectively controlled by a second control signal from the control logic; and
wherein the control logic is to:
generate a plurality of first control signals to selectively control the first bank of capacitors of the plurality of self-referenced delay cell circuits, wherein respective ones of the plurality of first control signals comprise an up value; and
generate a plurality of second control signals to selectively control the second bank of capacitors of the plurality of self-referenced delay cell circuits, wherein respective ones of the plurality of second control signals comprise a down value, and wherein the up values vary relative to the down values across the plurality of first and second control signals.

2. The TDC circuit of claim 1, wherein capacitors of the first bank of capacitors are equal in size and number to capacitors of the second bank of capacitors.

3. The TDC circuit of claim 1, wherein the plurality of first control signals and the plurality of second control signals are generated in control signal pairs, one control signal pair to be provided to each respective self-reference delay cell circuit, and wherein the control logic is further to rotate the control signal pairs to different ones of the plurality of self-referenced delay cell circuits over time according to one of a sequential pattern or a pseudo-random pattern.

4. The TDC circuit of claim 1, wherein the control logic is further to alternate incrementing the up value within the respective ones of the plurality of first control signals with decrementing the down value within the respective ones of the plurality of second control signals.

5. The TDC circuit of claim 1, wherein the control logic is further to alternate decrementing the up value within the respective ones of the plurality of first control signals with incrementing the down value within the respective ones of the plurality of second control signals.

6. The TDC circuit of claim 1, further comprising:
a plurality of phase detectors coupled to respective outputs of the plurality of self-referenced delay cell circuits; and
an adder coupled to outputs of the plurality of phase detectors, the adder to generate a multi-bit output that represents a time difference between the incoming up signal and the incoming down signal.

7. The TDC circuit of claim 6, further comprising mapping logic coupled to the adder, the mapping logic to map the multi-bit output to a digital code that is at least one bit smaller than the multi-bit output and quantifies the time difference.

8. A phase-locked loop (PLL) comprising:
a phase-frequency detector;
a digitally-controlled oscillator (DCO); and
a time-to-digital converter (TDC) circuit coupled between the phase-frequency detector and the DCO, the TDC circuit comprising:
control logic; and
a plurality of self-referenced delay cell circuits coupled to the control logic, wherein each self-referenced delay cell circuit of the plurality of self-referenced delay cell circuits comprises:
a first inverter coupled in series with a second inverter, the first inverter to receive a positive time signal representative of an incoming up signal;
a third inverter coupled in series with a fourth inverter, the third inverter to receive a negative time signal representative of an incoming down signal;
a first bank of capacitors coupled to a first node between the first inverter and the second inverter, wherein the first bank of capacitors is selectively controlled by a first control signal from the control logic; and
a second bank of capacitors coupled to a second node between the third inverter and the fourth inverter, wherein the second bank of capacitors is selectively controlled by a second control signal from the control logic; and
wherein the control logic is to:
generate a plurality of first control signals to selectively control the first bank of capacitors of the plurality of self-referenced delay cell circuits, wherein respective ones of the plurality of first control signals comprise an up value; and
generate a plurality of second control signals to selectively control the second bank of capacitors of the plurality of self-referenced delay cell circuits, wherein respective ones of the plurality of second control signals comprise a down value, and wherein the up values vary relative to the down values across the plurality of first and second control signals.

9. The PLL of claim 8, wherein capacitors of the first bank of capacitors are equal in size and number to capacitors of the second bank of capacitors.

10. The PLL of claim 8, wherein the plurality of first control signals and the plurality of second control signals are generated in control signal pairs, one control signal pair to be provided to each respective self-reference delay cell circuit, and wherein the control logic is further to rotate the control signal pairs to different ones of the plurality of self-referenced delay cell circuits over time according to one of a sequential pattern or a pseudo-random pattern.

11. The PLL of claim 8, wherein the control logic is further to alternate incrementing the up value within the respective ones of the plurality of first control signals with decrementing the down value within the respective ones of the plurality of second control signals.

12. The PLL of claim 8, wherein the control logic is further to alternate decrementing the up value within the respective ones of the plurality of first control signals with incrementing the down value within the respective ones of the plurality of second control signals.

13. The PLL of claim 8, wherein the TDC further comprises:
a plurality of phase detectors coupled to respective outputs of the plurality of self-referenced delay cell circuits; and
an adder coupled to outputs of the plurality of phase detectors, the adder to generate a multi-bit output that represents a time difference between the incoming up signal and the incoming down signal.

14. The PLL of claim 13, wherein the TDC further comprises mapping logic coupled to the adder, the mapping logic to map the multi-bit output to a digital code that is at least one bit smaller than the multi-bit output and quantifies the time difference.

15. The PLL of claim 8, further comprising:
digital integral path circuitry coupled between the TDC circuit and the DCO; and
analog proportional path circuitry coupled between the phase-frequency detector and the DCO.

16. A method of operating a time-to-digital converter (TDC), which comprises a plurality of self-referenced delay cell circuits, wherein each self-referenced delay cell circuit of the plurality of self-referenced delay cell circuits comprises: a first inverter coupled in series with a second inverter; a third inverter coupled in series with a fourth inverter; a first bank of capacitors coupled to a first node between the first inverter and the second inverter; and a second bank of capacitors coupled to a second node between the third inverter and the fourth inverter, wherein the method of operating the TDC comprises:
providing, to the first inverter, a positive time signal representative of an incoming up signal;
providing, to the third inverter, a negative time signal representative of an incoming down signal;
generating a plurality of first control signals to selectively control the first bank of capacitors of the plurality of self-referenced delay cell circuits, wherein respective ones of the plurality of first control signals comprise an up value;
generating a plurality of second control signals to selectively control the second bank of capacitors of the plurality of self-referenced delay cell circuits, wherein respective ones of the plurality of second control signals comprise a down value; and
varying the up values relative to the down values across the plurality of first and second control signals.

17. The method of operating the TDC of claim 16, wherein generating the plurality of first control signals and the second control signals comprise:
generating the plurality of first control signals and second control signals in control signal pairs, one control signal pair to be provided to each respective self-reference delay cell circuit; and
rotating the control signal pairs to different ones of the plurality of self-referenced delay cell circuits over time according to one of a sequential pattern or a pseudo-random pattern.

18. The method of operating the TDC of claim 16, further comprising alternating incrementing the up value within the respective ones of the plurality of first control signals with decrementing the down value within the respective ones of the plurality of second control signals.

19. The method of operating the TDC of claim 16, further comprising alternating decrementing the up value within the respective ones of the plurality of first control signals with incrementing the down value within the respective ones of the plurality of second control signals.

20. The method of operating the TDC of claim 16, wherein each first control signal corresponds to a positive threshold associated with the incoming up signal, and wherein each second control signal corresponds to a negative threshold associated with the incoming down signal.

\* \* \* \* \*